(12) United States Patent
Huang et al.

(10) Patent No.: US 10,034,379 B2
(45) Date of Patent: Jul. 24, 2018

(54) STACKED ELECTRONIC STRUCTURE

(71) Applicant: CYNTEC CO., LTD., Hsinchu (TW)

(72) Inventors: Chi-Feng Huang, Taipei (TW);
Bau-Ru Lu, Changhua County (TW);
Da-Jung Chen, Taoyuan County (TW)

(73) Assignee: CYNTEC CO., LTD., Hsinchu (TW)

( * ) Notice: Subject to any disclaimer, the term of this patent is extended or adjusted under 35 U.S.C. 154(b) by 97 days.

(21) Appl. No.: 15/297,190

(22) Filed: Oct. 19, 2016

(65) Prior Publication Data

US 2017/0223834 A1 Aug. 3, 2017

Related U.S. Application Data

(60) Provisional application No. 62/288,459, filed on Jan. 29, 2016.

(51) Int. Cl.
*H05K 1/18* (2006.01)
*H01F 27/29* (2006.01)
*H01F 27/06* (2006.01)

(52) U.S. Cl.
CPC ............ *H05K 1/181* (2013.01); *H01F 27/06* (2013.01); *H01F 27/292* (2013.01); *H01F 2027/065* (2013.01); *H01F 2027/297* (2013.01); *H05K 2201/1003* (2013.01); *H05K 2201/10015* (2013.01); *H05K 2201/10022* (2013.01); *H05K 2201/10166* (2013.01); *H05K 2201/10174* (2013.01)

(58) Field of Classification Search
USPC ......................................................... 361/808
See application file for complete search history.

(56) References Cited

U.S. PATENT DOCUMENTS

| | | | |
|---|---|---|---|
| 2004/0228097 A1* | 11/2004 | Chen ................... | H01L 23/3735 361/719 |
| 2005/0093121 A1* | 5/2005 | Chen ................... | H01L 23/4334 257/678 |
| 2012/0236519 A1* | 9/2012 | Chen ..................... | H05K 1/181 361/752 |
| 2015/0055315 A1* | 2/2015 | Lu ......................... | H01L 23/495 361/808 |

* cited by examiner

*Primary Examiner* — Timothy Thompson
*Assistant Examiner* — Krystal Robinson
(74) *Attorney, Agent, or Firm* — Min-Lee Teng; Litron Patent & Trademark Office

(57) ABSTRACT

A stacked electronic structure is provided. The stacked electronic structure includes: a magnetic device, electronic devices, and a substrate. The substrate is disposed under the magnetic device. First and second electronic devices are disposed between a bottom surface of the magnetic device and a top surface of the substrate. The first and second electronic devices comprise first and third terminals, disposed on first and second surfaces thereof, respectively, electrically connected to the magnetic device without using the substrate. The first and second electronic devices also comprise second and fourth terminals, disposed on second and fourth surfaces thereof, respectively, electrically connected to the substrate.

20 Claims, 5 Drawing Sheets

STACKED ELECTRONIC STRUCTURE

CROSS-REFERENCE TO RELATED APPLICATIONS

The present application application claims the benefit of U.S. Provisional Application Ser. No. 62/288,459 filed on Jan. 29, 2016, the entirety of which is incorporated by reference herein.

BACKGROUND OF THE INVENTION

Field of the Invention

The invention relates to stacked electronic structures.

Description of the Related Art

Electronic structures, such as power modules and DC-DC converters, typically include electronic devices, having interconnecting circuitry, electrically connected to a substrate. The devices are coupled to leads for connection to conductive patterns and/or other electronic assemblies.

One conventional approach to reducing the surface area occupied by the electronic structures in compact electronic products is to stack the assembled devices. For example, as shown in FIG. 1, an electronic structure 100 comprises a magnetic body 120 stacked over a PCB substrate 110, having electronic devices 112 therebetween. The magnetic body 120 is structurally supported by outer conductive leads 102 and 104, which are mounted to respective sides of the PCB substrate 110, which not only requires more surface area of the substrate for accommodating the leads 102, 104, but also increases the overall impedance caused by the leads 102, 104.

Accordingly, there is demand for a better stacked electronic structure to solve the aforementioned problems.

SUMMARY OF THE INVENTION

In one embodiment, a stacked electronic structure is disclosed, wherein the stacked electronic structure comprises: a magnetic device: a substrate, wherein the substrate is disposed under the magnetic device; and a first electronic device, disposed between a bottom surface of the magnetic device and a top surface of the substrate, wherein the first electronic device comprises a first terminal and a second terminal, wherein the first terminal is electrically connected to the magnetic device without using the substrate and the second terminal is electrically connected to the substrate; and a second electronic device, disposed between a bottom surface of the magnetic device and a top surface of the substrate, wherein the second electronic device comprises a third terminal and a fourth terminal, wherein the third terminal is electrically connected to the magnetic device without using the substrate and the fourth terminal is electrically connected to the substrate.

In one embodiment, the first terminal is disposed on a first surface of the first electronic device, and the second terminal is disposed on a second surface of the first electronic device opposite to the first surface.

In one embodiment, the third terminal is disposed on a third surface of the second electronic device, and the fourth terminal is disposed on a fourth surface of the second electronic device opposite to the third surface.

In one embodiment, a third electronic device is disposed in a space formed by the magnetic device, the first electronic device, the second electronic device and the substrate, wherein the third electronic device is electrically connected to the substrate.

In one embodiment, the magnetic device comprises an inductor or choke.

In one embodiment, the first electronic device is an active electronic component.

In one embodiment, the first electronic device is a passive electronic component.

In one embodiment, the first electronic device is at least partially encapsulated in a first bridge structure disposed at a first outer edge of the magnetic device, and the second electronic device is at least partially encapsulated in a second bridge structure disposed at a second outer edge of the magnetic device opposite to the first outer edge, wherein at least one portion of the first bridge structure extends from the bottom surface of the magnetic device to the top surface of the substrate, and at least one portion of the second bridge structure extends from the bottom surface of the magnetic device to the top surface of the substrate for supporting the magnetic device over the substrate.

In one embodiment, the magnetic device comprises a magnetic body, and wherein the magnetic body has a first support protrusion and a second support protrusion, wherein the first support protrusion and second support protrusion extends from the bottom surface of the magnetic device to the top surface of the substrate to form the first bridge structure and second bridge structure, respectively.

In one embodiment, the first electronic device is fully encapsulated in a first bridge structure disposed at a first outer edge of the magnetic device, and the second electronic device is fully encapsulated in a second bridge structure disposed at a second outer edge of the magnetic device opposite to the first outer edge.

In one embodiment, the first bridge structure comprises a conductive path to electrically connect the magnetic device to the first terminal of the first electronic device, and the second bridge structure comprises a conductive path to electrically connect the magnetic device to the third terminal of the second electronic device.

In one embodiment, the first electronic device is in contact with the bottom surface of the magnetic device for supporting the magnetic device over the substrate.

In one embodiment, each of the first electronic device and the second electronic device is in contact with the bottom surface of the magnetic device for supporting the magnetic device over the substrate.

In one embodiment, the magnetic device has an embedded electrode on the bottom surface thereof, and wherein the first terminal on the first surface of the first electronic device is soldered to the embedded electrode of the magnetic device and the second terminal on the second surface of the first electronic device is soldered to the top surface of the substrate.

In one embodiment, a first current flows between an embedded electrode of the magnetic device and the substrate via a conductive path between the first terminal and the second terminal of the first electronic device.

In one embodiment, a first current flows between an embedded electrode of the magnetic device and the substrate via a first conductive path between the first terminal to the second terminal of the first electronic device, and wherein a second current flows between the embedded electrode of the magnetic device and the substrate via a second conductive path between the third terminal and the fourth terminal of the second electronic device.

In one embodiment, the first electronic device is a first MOSFET and the second electronic device is a second MOSFET, and the magnetic device is a choke, and wherein a first terminal of the choke is electrically connected to the first MOSFET and the second MOSFET.

In one embodiment, the magnetic device has an embedded electrode on the bottom surface thereof, the first terminal on the first surface of the first electronic device is soldered to the embedded electrode of the magnetic device, and the second terminal on the second surface of the first electronic device is soldered to the top surface of the substrate; and wherein the third terminal on the third surface of the second electronic device is soldered to the embedded electrode of the magnetic device, and the fourth terminal on the fourth surface of the second electronic device is soldered to the top surface of the substrate.

In one embodiment, a first current flows between an embedded electrode of the magnetic device and the substrate via a first conductive path between a drain terminal and a source terminal of the first MOSFET, and a second current flows between the embedded electrode of the magnetic device and the substrate via a second conductive path between a drain terminal and a source terminal of the second MOSFET.

BRIEF DESCRIPTION OF THE DRAWINGS

The present invention can be more fully understood by reading the subsequent description and examples with references made to the accompanying drawings, wherein.

DETAILED DESCRIPTION OF THE INVENTION

Figure 1:
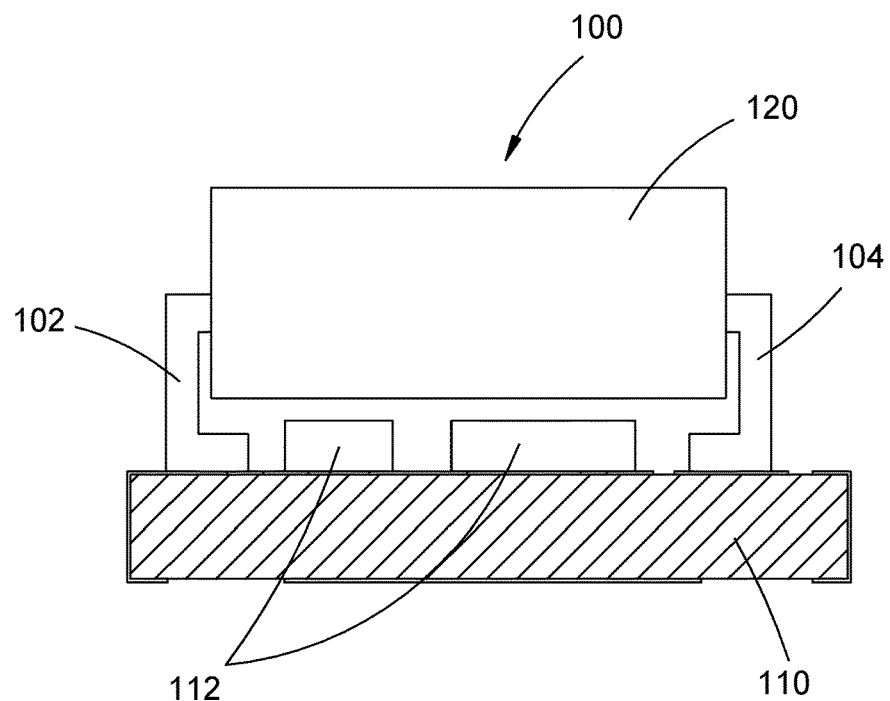
FIG. 1 is a partially schematic, cross-sectional side view of an electronic structure in accordance with the prior art.

It is understood that the following disclosure provides many different embodiments, or examples, for implementing different features of the invention. Specific examples of devices and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features are formed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

In an embodiment, a stacked electronic structure is provided. The stacked electronic structure includes: a magnetic device, electronic devices, and a substrate. The substrate is disposed under the magnetic device. First and second electronic devices are disposed between a bottom surface of the magnetic device and a top surface of the substrate. The first and second electronic devices comprise first and third terminals, disposed on first and second surfaces thereof, respectively, electrically connected to the magnetic device without using the substrate. The first and second electronic devices also comprise second and fourth terminals, disposed on second and fourth surfaces thereof, respectively, electrically connected to the substrate.

Figure 2:
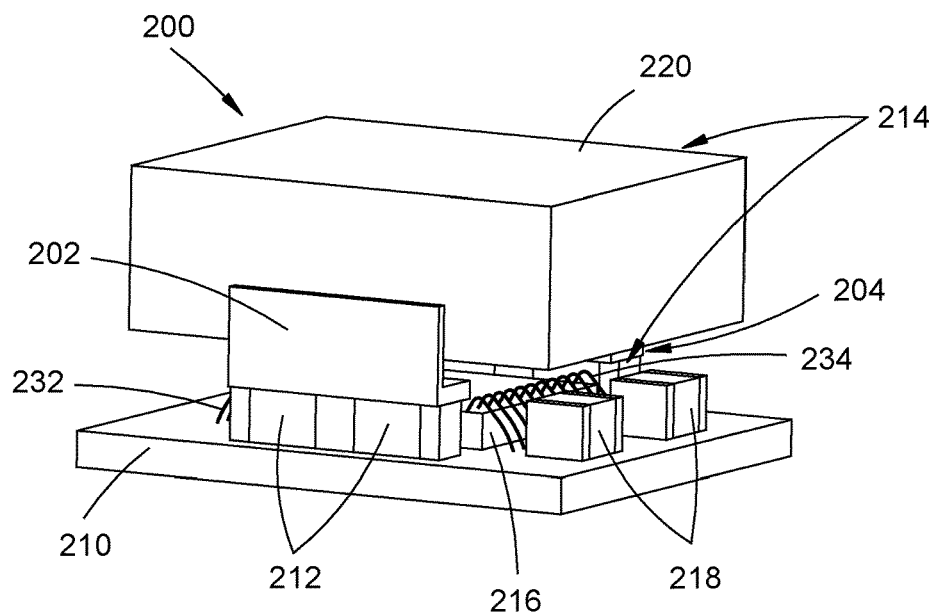
FIG. 2 is a schematic view of a stacked electronic structure in accordance with an embodiment of the invention.

FIG. 2 is a schematic view of a stacked electronic structure 200 in accordance with an embodiment of the invention. As shown in FIG. 2, the stacked electronic structure 200 includes a magnetic device encapsulated in a magnetic body 220, first, second and third electronic devices 212, 214, 216, respectively, and a substrate 210 having circuits therein. The magnetic device having the magnetic body 220 may comprise an inductor or choke and the magnetic body 220 may comprise conductive material. The substrate 210 can be a printed current board, BT board, metallic substrate or ceramic substrate and may be a two-layered or multi-layered substrate. The top surface of the substrate 210 is disposed under the bottom surface of the magnetic device having the magnetic body 220, and first and second bridge structures 202, 204, respectively, are disposed therebetween. The first and second bridge structures 202, 204, respectively, structurally support the magnetic device having the magnetic body 220 at first and second outer edges thereof and may comprise conductive materials. At least one portion of the first and second bridge structures 202, 204, respectively, extend from the bottom surface of the magnetic body 220 to the top surface of substrate 210 for supporting the magnetic body 220 over the substrate 210. The first and second bridge structures 202, 204, respectively, also encapsulate at least a part of first and second electronic devices 212, 214, respectively. A third electronic device 216 is disposed in a space formed by the magnetic body 220, the first and second electronic devices 212, 214, and the substrate 210. The first and second electronic devices 212, 214, respectively, comprise passive electronic components such as resistors and capacitors and the third electronic device 216 comprises active electronic components such as controller ICs, diodes and MOSFET (Metal-Oxide-Semiconductor Field-Effect Transistor).

Still, referring to the embodiment of FIG. 2, the magnetic device having the magnetic body 220 is electrically connected to first and third terminals, disposed on first and third surfaces of the first and second electronic devices 212, 214, respectively, without using the substrate. Also, the first and second electronic devices 212, 214, are electrically connected to the substrate 210, through second and fourth terminals thereof, respectively, disposed on second and fourth surfaces thereof, respectively. Meanwhile, the third electronic device 216 is electrically connected to the substrate 210 through wiring 232, 234, such as gold, copper, or aluminum wiring.

In yet some other embodiments, more than one electronic device may be encapsulated in the first and second bridge structures 202, 204, respectively, and more than one electronic devices 218 may be disposed thereamong. Additionally, passive and active electronic components may be used in any combination among the electronic devices.

Figure 3A:
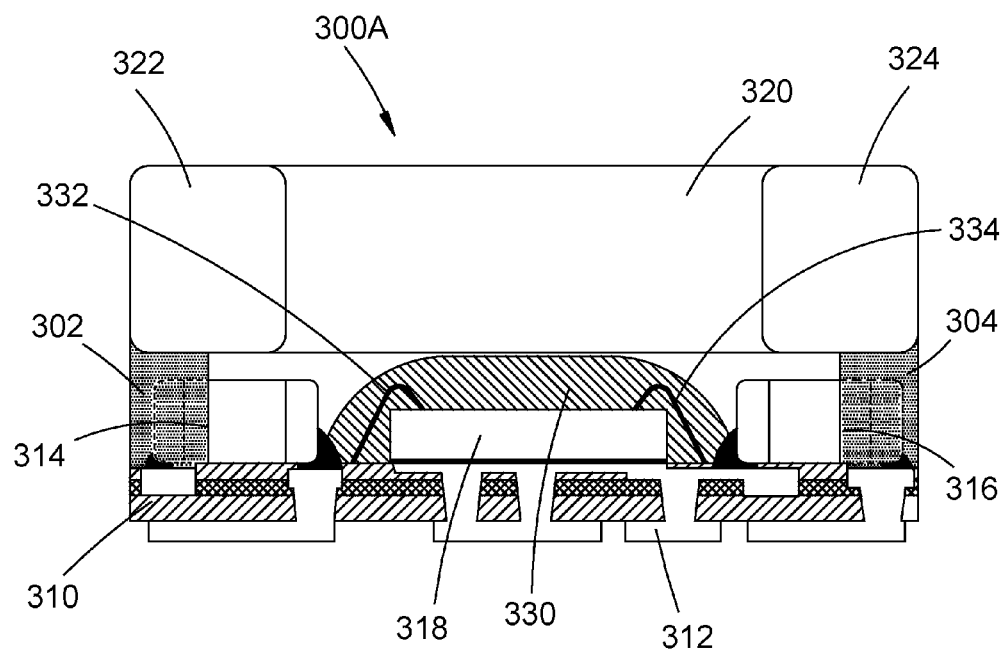
FIG. 3A is a partially schematic, cross-sectional side view of a stacked electronic structure in accordance with another embodiment of the invention.

FIG. 3A is a partially schematic, cross-sectional side view of a stacked electronic structure in accordance with another embodiment of the invention. As shown in FIG. 3A, a stacked electronic structure 300A includes a magnetic device 320, first, second and third electronic devices 314, 316, 318, respectively, and a substrate 310 having circuits 312 therein. The magnetic device 320 comprises an inductor or choke. The substrate 310 can be a printed current board, BT board, metallic substrate or ceramic substrate and may be a two-layered or multi-layered substrate. The magnetic device 320 has first and second electrodes 322, 324, disposed on first and second outer edges thereof, respectively. The top surface of the substrate 310 is disposed under the bottom surface of the magnetic device 320, and first and second bridge supports 302, 304, respectively, are disposed therebetween. The first and second bridge supports 302, 304, respectively, structurally support the magnetic device 320 at the first and second outer edges thereof and may comprise conductive materials. At least one portion of the first and second bridge supports 302, 304, respectively, extend from the bottom surface of the magnetic device 320 to the top surface of substrate 310 for supporting the magnetic device 320 over the substrate 310. The first and second bridge supports 302, 304, respectively, are disposed on the outer opposite edges of the substrate 310 and the magnetic device 320 is disposed thereon. The first and second bridge supports 302, 304, respectively, encapsulate at least a part of first and second electronic devices 314, 316, respectively. A third electronic device 318 is disposed in a space formed by the magnetic device 320, the first and second electronic devices 314, 316, and the substrate 310. The first and second electronic devices 314, 316, respectively, comprise passive electronic components such as resistors and capacitors and the third electronic device comprises active electronic components such as controller ICs, diodes and MOSFETs.

Still, referring to the embodiment of FIG. 3A, the magnetic device 320 is electrically connected to first and third terminals, disposed on first and third surfaces of the first and second electronic devices 314, 316, respectively, without using the substrate. Also, the first and second electronic devices 314, 316 are electrically connected to the substrate 310, through second and fourth terminals thereof, respectively, disposed on second and fourth surfaces thereof, respectively. Meanwhile, the third electronic device 318 is electrically connected to the substrate 310 through wiring 332, 334, such as gold, copper, or aluminum wiring.

In another embodiment of the stacked electronic structure 300A of FIG. 3A, more than one electronic device may be encapsulated in the first and second bridge supports 302, 304, respectively, and more than one electronic device may be disposed therebetween. Additionally, passive and active electronic components may be used in any combination among the electronic devices.

In yet another embodiment of the invention, the third electronic device 318 is encapsulated within an encapsulating material 330 and the encapsulating material 330 may comprise epoxy resin.

Figure 3B:
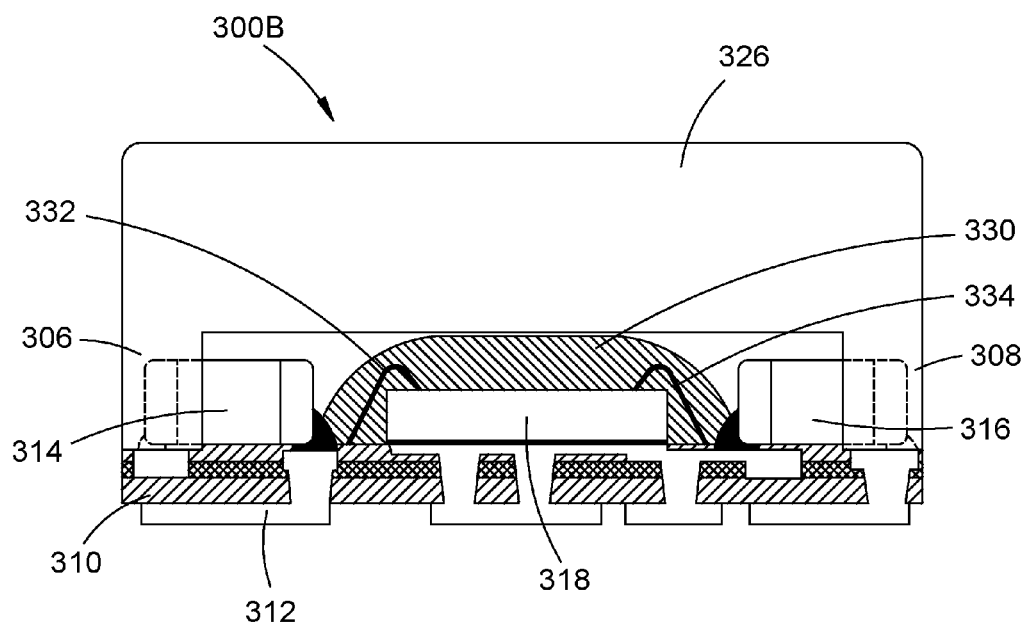
FIG. 3B is a partially schematic, cross-sectional side view of a stacked electronic structure in accordance with yet another embodiment of the invention.

FIG. 3B is a partially schematic, cross-sectional side view of a stacked electronic structure in accordance with yet another embodiment of the invention. The difference in the embodiment of FIG. 3A and the embodiment of FIG. 3B, is that in the embodiment of the stacked electronic structure 300B of FIG. 3B, the magnetic device has a body 326 that has first and second support protrusions 306, 308, wherein at least a part of the first electronic device 314 is encapsulated by the first support protrusion; and at least a part of second electronic device 316 is encapsulated by the second support protrusion. In one embodiment, the magnetic device is an inductor or choke, and body 326 is a magnetic body enclosing a coil or a conductor wire to form an inductor or choke, wherein the inductor or choke is electrically connected to the first electronic device 314 and the second electronic device 316 through conductive paths in the first and second protrusion, respectively, without using the substrate. The substrate 310 can be a printed current board, BT board, metallic substrate or ceramic substrate and may be a two-layered or multi-layered substrate. In one embodiment, a third electronic device 318 is disposed in a space formed by the body 326, the first and second electronic devices 314 316, and the substrate 310. The first and second electronic devices 314, 316, respectively, comprise passive electronic components such as resistors and capacitors and the third electronic device comprises active electronic components such as controller ICs, diodes and MOSFETs. As for the additional embodiments of FIG. 3A, which may also be applied to FIG. 3B, they will not be repeated again for brevity.

Figure 4A:
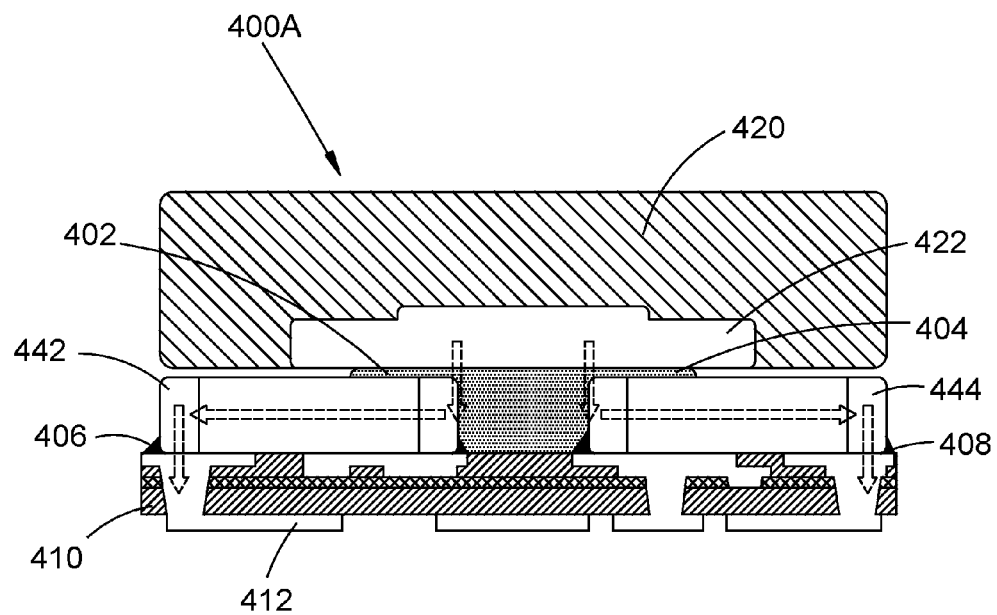
FIG. 4A is a partially schematic, cross-sectional side view of a stacked electronic module in accordance with another embodiment of the invention.

FIG. 4A is a partially schematic, cross-sectional side view of a stacked electronic module in accordance with another embodiment of the invention. As shown in FIG. 4A, a stacked electronic module 400A includes a magnetic device 420 having an embedded electrode 422 on the bottom surface thereof, first and second electronic devices 442, 444, respectively, and a substrate 410 having circuits 412 therein. The magnetic device 420 comprises an inductor or choke. The substrate 410 can be a printed current board, BT board, metallic substrate or ceramic substrate and may be a two-layered or multi-layered substrate. The top surface of the substrate 410 is disposed under the bottom surface of the magnetic device 420, and first and second electronic devices 442, 444, respectively, are disposed therebetween. The first and second electronic devices 442, 444, respectively, structurally support the magnetic device 520 at first and second outer edges thereof, respectively, and have first and third terminals 402, 404, disposed on first and third surfaces, thereof, respectively, soldered to the embedded electrode 422 of the magnetic device 420, such that the magnetic device 420 is electrically connected to the first and third terminals, disposed on the first and third surfaces of the first and second electronic devices 442, 444, respectively, without using the substrate. Meanwhile, the first and second electronic devices 442, 444, disposed at respective edges of the substrate 410, have second and fourth terminals 406, 408, respectively, soldered to the top surface of the substrate 410, such that the second and fourth terminals thereof, are electrically connected to the substrate 410. The first and second electronic devices 442, 444, respectively, may comprise passive electronic components such as resistors and capacitors.

The stacked electronic module 400A may also comprise a first and second current, wherein the first and second current flows from the embedded electrode 422 of the magnetic device 420 to the substrate 410 via first and second conductive paths, respectively, between the first and third terminals 402, 404, of the first and second electronic devices 442, 444, respectively, to the second and fourth terminals of the first and second electronic devices 442, 444, respectively.

Figure 4B:
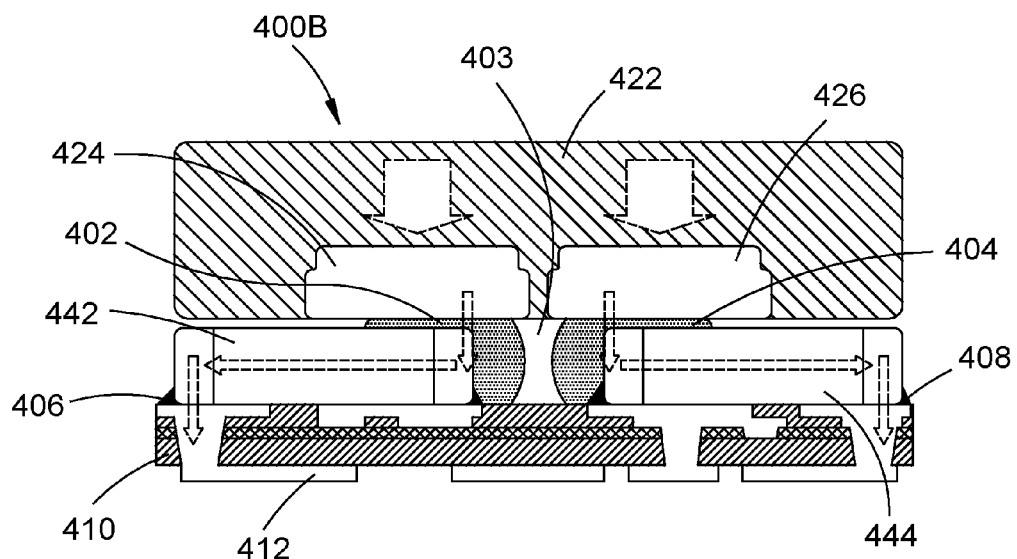
FIG. 4B is a partially schematic, cross-sectional side view of a stacked electronic module in accordance with yet another embodiment of the invention.

FIG. 4B is a partially schematic, cross-sectional side view of a stacked electronic module in accordance with yet another embodiment of the invention. The difference in the embodiment of FIG. 4A and the embodiment of FIG. 4B, is that in the embodiment of the stacked electronic module 400B of FIG. 4B, the magnetic device 422 has first and second embedded electrodes, 424, 426, respectively, on the bottom surface thereof, along with a substrate 410 having circuits 412 therein. Note that the invention is not limited to just one or two embedded electrodes on the bottom of the magnetic device 422. In another embodiment, more than two embedded electrodes may be embedded to the bottom of the magnetic device 422. Meanwhile, another difference in the embodiment of FIG. 4A and the embodiment of FIG. 4B, is that in the embodiment, there is a solder gap 403 between the first and second electronic devices 442, 444, respectively.

Still referring to FIG. 4B, the magnetic device 422 comprises an inductor or choke. The substrate 410 can be a printed current board, BT board, metallic substrate or ceramic substrate and may be a two-layered or multi-layered substrate. The top surface of the substrate 410 is disposed under the bottom surface of the magnetic device 422, and first and second electronic devices 442, 444, respectively, are disposed therebetween. The first and second electronic devices 442, 444, respectively, structurally support the magnetic device 520 at first and second outer edges thereof, respectively, and have first and third terminals, disposed on first and third surfaces 402, 404, respectively, soldered to the first and second embedded electrodes, 424, 426, respectively, of the magnetic device 420, such that the magnetic device 420 is electrically connected to the first and third terminals, disposed on first and third surfaces of the first and second electronic devices 442, 444, respectively, without using the substrate. Meanwhile, the first and second electronic devices 442, 444, disposed at respective edges of the substrate 410, have second and fourth terminals 406, 408, disposed on second and fourth surfaces thereof, respectively, soldered to the top surface of the substrate 410, such that the second and fourth terminals thereof, are electrically connected to the substrate 410. The first and second electronic devices 442, 444, respectively, may comprise passive electronic components such as resistors and capacitors. As for the additional embodiments of FIG. 4A, which may also be applied to FIG. 4B, they will not be repeated again for brevity.

In the embodiments of the invention, conductive material such as solder, is used to electrical connect the magnetic device to the electronic devices, and the electronic devices to the substrate. Accordingly, the magnetic device is electrically connected to the electronic devices, without using the substrate. Thus, a shorter conductive path is achieved, which not only decreases the surface area required of the stacked electronic structure or module, but also decreases the overall impedance caused by the conductive paths. Furthermore, modulation and design flexibility may be achieved, through the design of the stacked electronic structure or module and use of the electronic devices, bridge structures, bridge supports, and support protrusions. With the substrate used as a circuitry design base, wherein required electrical properties may be met and location of devices may be determined, a more customized stacked electronic structure or module may be achieved with increased design flexibility.

Figure 5A:
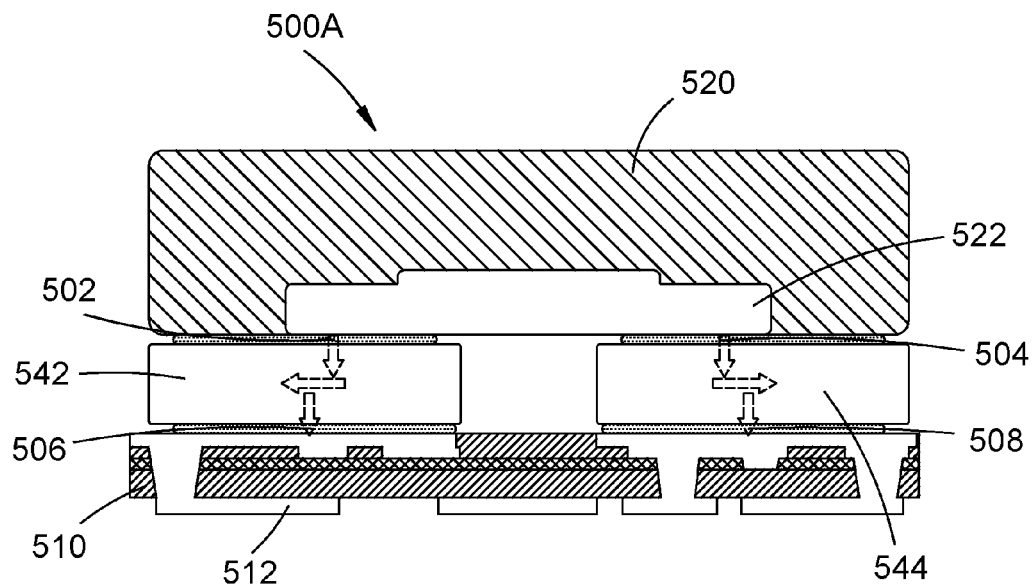
FIG. 5A is a partially schematic, cross-sectional side view of a stacked electronic module in accordance with another embodiment of the invention.

FIG. 5A is a partially schematic, cross-sectional side view of a stacked electronic module in accordance with another embodiment of the invention. As shown in FIG. 7, a stacked electronic module 500A includes a magnetic device 520 having an embedded electrode 522 on the bottom surface thereof, first and second electronic devices 542, 544, respectively, and a substrate 510 having circuits 512 therein. The magnetic device 520 comprises an inductor or choke. The substrate 510 can be a printed current board, BT board, metallic substrate or ceramic substrate and may be a two-layered or multi-layered substrate. The top surface of the substrate 510 is disposed under the bottom surface of the magnetic device 520, and first and second electronic devices 542, 544 are disposed therebetween. The first and second electronic devices 542, 544, structurally support the magnetic device 520 at first and second outer edges thereof, respectively, and have first and third terminals 502, 504, on first and third surfaces, thereof, respectively, soldered to the embedded electrode 522 of the magnetic device 520, such that the magnetic device 520 is electrically connected to the first and third terminals 502, 504, thereof, respectively, without using the substrate 510. Meanwhile, the first and second electronic devices 542, 544, disposed at respective edges of the substrate 510, have second and fourth terminals 506, 508, respectively, on second and third surfaces, respectively, soldered to the top surface of the substrate 510, such that second and fourth terminals 506, 508, thereof, are electrically connected to the substrate 510. The first and second electronic devices 542, 544 may comprise active electronic components such as controller ICs, diodes and MOSFETs.

The stacked electronic module 500A also comprises a first and second current, wherein the first and second current flows from between the embedded electrode 522 of the magnetic device 520 to the substrate 510 via first and second conductive paths, respectively, between the first and third terminals 502, 504, of the first and second electronic devices 542, 544, respectively, to the second and fourth terminals 506, 508, of the first and second electronic devices 542, 544, respectively.

Figure 5B:
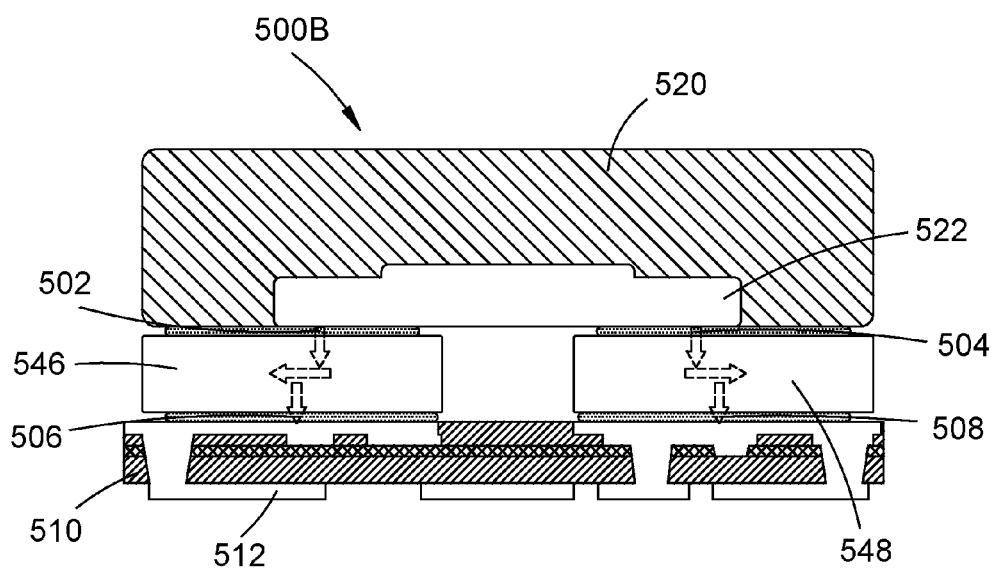
FIG. 5B is a partially schematic, cross-sectional side view of a stacked electronic module in accordance with yet another embodiment of the invention.

FIG. 5B is a partially schematic, cross-sectional side view of a stacked electronic module in accordance with yet another embodiment of the invention. The difference in the embodiment of FIG. 5A and the embodiment of FIG. 5B, is that in the embodiment of the stacked electronic module 500B of FIG. 5B, the first and second electronic devices 546, 548 of the stacked electronic module 500B, respectively, comprise MOSFETs. Similarly, the stacked electronic module 500B includes a magnetic device 520 having an embedded electrode 522 on the bottom surface thereof and a substrate 510 having circuits 512 therein. The magnetic device 520 comprises an inductor or choke. The substrate 510 can be a printed current board, BT board, metallic substrate or ceramic substrate and may be a two-layered or multi-layered substrate. The top surface of the substrate 510 is disposed under the bottom surface of the magnetic device 520, and first and second electronic devices 546, 548 are disposed therebetween. The first and second electronic devices 546, 548, structurally support the magnetic device 520 at first and second outer edges thereof, respectively, and have first and third terminals, 502, 504, respectively, of first and third surfaces thereof, respectively, soldered to the embedded electrode 522 of the magnetic device 520, such that the magnetic device 520 is electrically connected to the first and third terminals thereof, respectively, without using the substrate 510. Meanwhile, the first and second electronic devices 542, 544, disposed at respective edges of the substrate 510, have second and fourth terminals 506, 508, respectively, on second and third surfaces thereof, respectively, soldered to the top surface of the substrate 510, such that second and fourth terminals 506, 508, are electrically connected to the substrate 510. As for the additional embodiments of FIG. 5A, which may also be applied to FIG. 5B, they will not be repeated again for brevity.

In the exemplary embodiments of the stacked electronic modules 400A, 400B, 500A and 500B of FIGS. 4A, 4B, 5A and 5B, respectively, the magnetic devices 420, 422, and 520 and the first and second bridge devices 442, 444, thereof, the first and second bridge devices 442, 444, thereof, and the first and second bridge devices 542, 544, thereof, respectively, are separately packaged, but, the invention is not limited thereto. The magnetic devices 420, 422, and 520 and the first and second bridge devices 442, 444, and the first and second bridge devices 542, 544, respectively, may be packaged separately or in any combination.

Figure 5C:
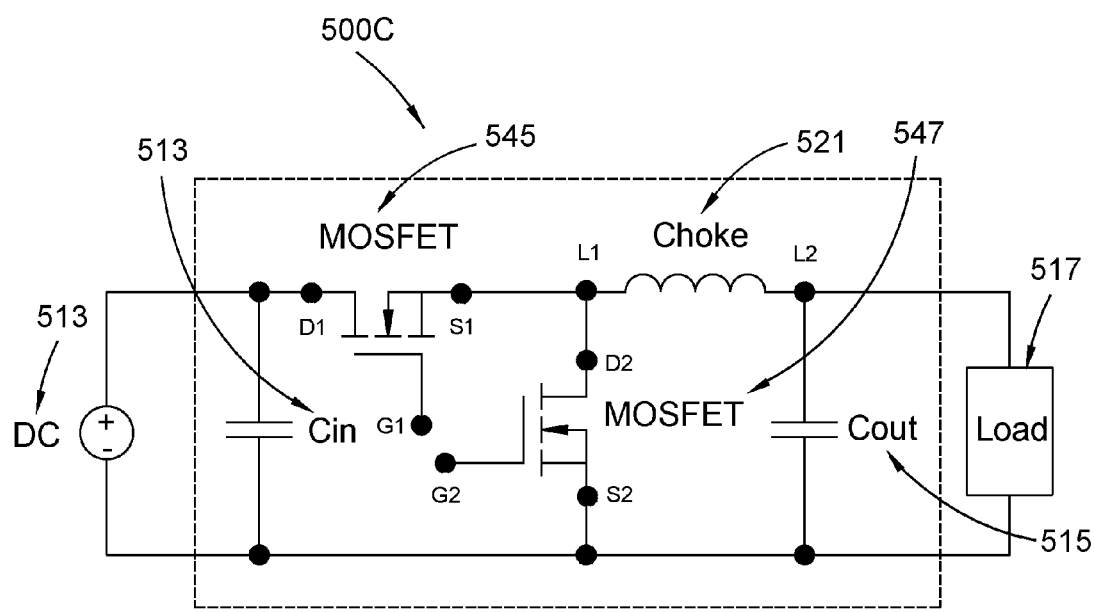
FIG. 5C is a schematic diagram of an embodiment of the stacked electronic module of FIG. 5B.

FIG. 5C is a schematic diagram of an embodiment of the stacked electronic module 500B of FIG. 5B, wherein a choke 521, having an embedded electrode on a bottom surface thereof, and first and second MOSFETs 545, 547 correspond to the magnetic device 520 having an embedded electrode 522 on the bottom surface thereof and the first and second electronic devices 546, 548, respectively, of the stacked electronic module 500B of FIG. 5B. The first MOSFET 545 has a first drain terminal D1, a first source terminal S1 and a first gate terminal G1, and the second MOSFET 547 has a second drain terminal D2, a second source terminal S2 and a second gate terminal G2. The Cin 513 and Cout 515 may be disposed on the substrate 510 in a space formed by the choke 521, MOSFETs 545, 547, and the substrate 510. The first drain terminal D1 of the first MOSFET 545 is electrically connected to the substrate 510 for connecting with a DC power supply 513. The first source terminal S1 of the first MOSFET 545 and the second drain terminal D2 of the second MOSFET 547 are electrically connected to a same first terminal L1 of the choke 521, and the second source terminal S2 of the second MOSFET 547 is electrically connected to the substrate 510 for connecting with a ground. A second terminal L2 of the choke 521 is electrically connected to the substrate 510 for connecting with a load 517.

In the embodiments of the invention, by using electrically conductive material, such as solder, to connect the magnetic device to the top terminals of electronic devices, without using the substrate, and then electrically soldering and connecting the bottom terminals of the electronic devices to the substrate, a shorter conductive path is achieved, which not only decreases the surface area required of the stacked electronic structure or module, but also decreases the overall impedance caused by the conductive paths. Additionally, the electrical connecting method may be beneficial for process yields during manufacturing when compared to using outer leads like in other electrical connecting methods. Furthermore, modulation and design flexibility may be achieved, through the design of the stacked electronic structure or module and use of the electronic devices, bridge structures, supports, and support protrusions. The substrate is used as a circuitry design base, wherein required electrical properties may be met and location of devices may be determined. Accordingly, a more customized stacked electronic structure or module may be achieved with increased design flexibility. Additionally, copper and other conductive metals may be used for electrical connectivity or the stacking of active electronic components, in order to strengthen electrical properties and achieve efficient electrical connections to form a complete stacked electronic structure or module.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:
1. A stacked electronic structure, comprising:
   a magnetic device:
   a substrate, wherein the substrate is disposed under the magnetic device; and
   a first electronic device, disposed between a bottom surface of the magnetic device and a top surface of the substrate, wherein the first electronic device comprises a first terminal and a second terminal, wherein the first terminal is electrically connected to the magnetic device without using the substrate and the second terminal is electrically connected to the substrate; and
   a second electronic device, disposed between a bottom surface of the magnetic device and a top surface of the substrate, wherein the second electronic device comprises a third terminal and a fourth terminal, wherein the third terminal is electrically connected to the magnetic device without using the substrate and the fourth terminal is electrically connected to the substrate.

2. The stacked electronic structure as claimed in claim 1, wherein the first terminal is disposed on a first surface of the first electronic device, and the second terminal is disposed on a second surface of the first electronic device opposite to the first surface.

3. The stacked electronic structure as claimed in claim 2, wherein the third terminal is disposed on a third surface of the second electronic device, and the fourth terminal is disposed on a fourth surface of the second electronic device opposite to the third surface.

4. The stacked electronic structure as claimed in claim 1, further comprising:
   a third electronic device, disposed in a space formed by the magnetic device, the first electronic device, the second electronic device and the substrate, wherein the third electronic device is electrically connected to the substrate.

5. The stacked electronic structure as claimed in claim 1, wherein the magnetic device comprises an inductor or choke.

6. The stacked electronic structure as claimed in claim 1, wherein the first electronic device is an active electronic component.

7. The stacked electronic structure as claimed in claim 1, wherein the first electronic device is a passive electronic component.

8. The stacked electronic structure as claimed in claim 1, wherein the substrate is one of the following: a printed current board, BT (Bismaleimide Triazine) board, metallic substrate or ceramic substrate.

9. The stacked electronic structure as claimed in claim 1, wherein the first electronic device is at least partially encapsulated in a first bridge structure disposed at a first outer edge of the magnetic device, and the second electronic device is at least partially encapsulated in a second bridge structure disposed at a second outer edge of the magnetic device opposite to the first outer edge, wherein at least one portion of the first bridge structure extends from the bottom surface of the magnetic device to the top surface of the substrate, and at least one portion of the second bridge structure extends from the bottom surface of the magnetic device to the top surface of the substrate for supporting the magnetic device over the substrate.

10. The stacked electronic structure as claimed in claim 9, further comprising:

a third electronic device, disposed in a space formed by the magnetic device, the first electronic device, the second electronic device and the substrate, wherein the third electronic device is electrically connected to the substrate.

11. The stacked electronic structure as claimed in claim 9, wherein the magnetic device comprises a magnetic body, and wherein the magnetic body has a first support protrusion and a second support protrusion, wherein the first support protrusion and second support protrusion extends from the bottom surface of the magnetic device to the top surface of the substrate to form the first bridge structure and second bridge structure, respectively.

12. The stacked electronic structure as claimed in claim 9, wherein the first bridge structure comprises a conductive path to electrically connect the magnetic device to the first terminal of the first electronic device, and the second bridge structure comprises a conductive path to electrically connect the magnetic device to the third terminal of the second electronic device.

13. The stacked electronic structure as claimed in claim 1, wherein the first electronic device is in contact with the bottom surface of the magnetic device for supporting the magnetic device over the substrate.

14. The stacked electronic structure as claimed in claim 13, wherein the second electronic device is in contact with the bottom surface of the magnetic device for supporting the magnetic device over the substrate.

15. The stacked electronic structure as claimed in claim 1, wherein the magnetic device has an embedded electrode on the bottom surface thereof, wherein the first terminal on a first surface of the first electronic device is soldered to the embedded electrode of the magnetic device and the second terminal on a second surface of the first electronic device is soldered to the top surface of the substrate.

16. The stacked electronic structure as claimed in claim 15, wherein a first current flows between the embedded electrode of the magnetic device and the substrate via a conductive path between the first terminal and the second terminal of the first electronic device.

17. The stacked electronic structure as claimed in claim 15, wherein the third terminal on a third surface of the second electronic device is soldered to the embedded electrode of the magnetic device and the fourth terminal on a fourth surface of the second electronic device is soldered to the top surface of the substrate.

18. The stacked electronic structure as claimed in claim 1, wherein the first electronic device is a first MOSFET and the second electronic device is a second MOSFET, and the magnetic device is a choke, and wherein a first terminal of the choke is electrically connected to the first MOSFET and the second MOSFET.

19. The stacked electronic structure as claimed in claim 18, wherein the magnetic device has an embedded electrode on the bottom surface thereof, wherein the first terminal on a first surface of the first MOSFET is soldered to the embedded electrode of the magnetic device, and the second terminal on a second surface of the first MOSFET is soldered to the top surface of the substrate; and wherein the third terminal on a third surface of the second MOSFET is soldered to the embedded electrode of the magnetic device, and the fourth terminal on a fourth surface of the second MOSFET is soldered to the top surface of the substrate.

20. The stacked electronic module as claimed in claim 18, wherein a first current flows between an embedded electrode of the magnetic device and the substrate via a first conductive path between a drain terminal and a source terminal of the first MOSFET, and a second current flows between the embedded electrode of the magnetic device and the substrate via a second conductive path between a drain terminal and a source terminal of the second MOSFET.

* * * * *